United States Patent [19]

Faraone

[11] Patent Number: 4,735,919
[45] Date of Patent: Apr. 5, 1988

[54] METHOD OF MAKING A FLOATING GATE MEMORY CELL

[75] Inventor: Lorenzo Faraone, Belle Mead, N.J.

[73] Assignee: General Electric Company, Schenectady, N.Y.

[21] Appl. No.: 852,289

[22] Filed: Apr. 15, 1986

[51] Int. Cl.$^4$ .................. H01L 21/283; H01L 21/316
[52] U.S. Cl. .......................... 437/43; 437/52; 437/983; 437/69; 357/23.5
[58] Field of Search ................... 29/571, 578, 580; 357/23.6, 23.5; 148/1.5; 437/43, 52, 69, 983

[56] References Cited

U.S. PATENT DOCUMENTS

| | | | |
|---|---|---|---|
| 4,162,504 | 7/1979 | Hsu | 357/23 |
| 4,274,012 | 6/1981 | Simko | 307/238.3 |
| 4,314,265 | 2/1982 | Simko | 357/23 |
| 4,334,347 | 6/1982 | Goldsmith et al. | 29/571 |
| 4,404,577 | 9/1983 | Cranford, Jr. et al. | 357/23 |
| 4,409,723 | 10/1983 | Harari | 29/571 |
| 4,426,764 | 1/1984 | Kosa et al. | 29/571 |
| 4,486,769 | 12/1984 | Simko | 357/41 |
| 4,488,931 | 12/1984 | Pansana | 156/643 |
| 4,495,693 | 1/1985 | Iwahashi et al. | 29/571 |
| 4,519,849 | 5/1985 | Korsh et al. | 148/1.5 |
| 4,683,640 | 8/1987 | Faraone | 437/41 |

*Primary Examiner*—Brian E. Hearn
*Assistant Examiner*—T. N. Quach
*Attorney, Agent, or Firm*—Henry I. Steckler; Bernard F. Plantz; Allen LeRoy Limberg

[57] ABSTRACT

A method of making a floating gate memory cell which relies on control gate to floating gate conduction to charge and discharge the floating gate. The gate oxide and inter-level dielectric thicknesses are independently controlled by using a mask which can compensate for the different substrate and floating gate oxidation rates.

17 Claims, 4 Drawing Sheets

METHOD OF MAKING A FLOATING GATE MEMORY CELL

This invention relates to a method of fabricating a floating gate memory cell. More particularly, the present invention relates to a method which provides for independent control of the thickness of the insulating layers used to make the memory cell.

BACKGROUND OF THE INVENTION

Floating gate type non-volatile semiconductor memory devices are generally known in the art. Commonly assigned U.S. Pat. No. 4,162,504 is an example of such a device. As shown in FIG. 1, the prior art device consists of a source 12 and drain 14 regions formed in a semiconductor substrate 10. On the surface of the substrate 10, between the source 12 and drain 14 regions, a first insulating layer 16 is provided. A floating gate 18 is positioned over a portion of the first insulating layer 16. A second insulating layer 20 is provided above the first insulating layer 16 and the floating gate 18. A conductive layer is placed on the second insulating layer 20 to form the control gate 22. Contacts 24, 26 and 28 are provided to complete the device.

The memory cell shown in FIG. 1 functions as three serially aligned transistors. The first transistor is formed by region I of substrate 10 functioning as a channel for source and drain regions 12 and 14, respectively. Region A of the second insulator 20, along with the portion of the first insulator 16 subtended by region A, function as a gate oxide for gate 22. A second transistor is formed by the floating gate 18, the region of the insulator 16 subtended by gate 18 and channel region II of the semiconductor substrate 10 which contains the source and drain regions 12 and 14, respectively. The third transistor, in series with the other transistors, is formed around channel region III with region A' of the second insulator 20 and the portion of the insulator 16 subtended by region A' functioning as the gate oxide for gate 22. Region B of insulator 20 functions as an inter-level dielectric between the floating and control gates 18 and 22, respectively.

The memory cell is programmed by forming a charge on the floating gate 18 which has the effect of changing the threshold voltage for conduction between source 12 and drain 14. A typical embodiment of the device is one in which region B of insulator 20 is thin enough to allow electron tunneling between the floating gate 18 and the control gate 22. When a negative charge is formed on the floating gate 18, the memory cell is considered to be in the written or programmed state. A writing or programming potential of about −30 volts is applied to the control gate 22 while the source and drain regions 12 and 14, respectively, are maintained at ground or at zero potential. The device may also be programmed by applying −15 volts to the control gate 22 while +15 volts is applied to the drain 14 and the source 12 is allowed to electrically float. The memory cell may then be erased by removing the negative charge that is stored on the floating gate 18. This is done by applying a +30 volts to the control gate 22 while the source and drain 12 and 14, respectively, are at zero or ground potential. The cell can also be erased by providing the control gate 22 with a potential of about +15 volts while maintaining −15 volts on the drain 14 and allowing the source 12 to float. The cell can also be erased by exposure to ultraviolet radiation which will discharge the floating gate 18.

Referring again to FIG. 1, these devices are fabricated by forming a thin first insulating layer 16 on the surface of the semiconductor substrate 10. The layer 16 may be, for example, thermally grown silicon dioxide. The first insulating layer 16 functions as the gate oxide for the floating gate 18 which is later formed.

After the oxide layer 16 is formed, a conductive layer of polycrystalline silicon (polysilicon) is deposited over the gate oxide layer 16. This conductive layer is typically deposited via chemical vapor deposition techniques, doped and patterned to form the floating gate 18.

Once the floating gate 18 has been formed, a second insulating layer 20 is provided over both the gate oxide layer 16 and the floating gate 18. This second insulating layer 20 may also be thermally grown silicon dioxide. Region B of insulator 20 is known as the tunnel oxide.

A polycrystalline silicon layer is then deposited atop the second insulating layer 20. This polycrystalline layer is doped and patterned to form the control gate 22. Source 12 and drain 14 regions are formed in the semiconductor substrate 10 such that they are aligned to the control gate 22. Contacts 24, 26 and 28 are added and a passivating layer (not shown) is deposited to complete the device.

The above-described method has an inherent drawback because the inter-level dielectric region B between the floating gate 18 and the control gate 22 is simultaneously formed when gate oxide regions A and A' are grown. Thus, the thickness of the gate oxide regions A and A' may dictate the thickness of the inter-level dielectric region B or vice versa. It is necessary in the memory cell art to have independent control of the thickness of the inter-level dielectric region B so that the tunnel oxide conduction properties and capacitance between the control gate 22 and the floating gate 18 can be optimized. If non-memory cell transistors are simultaneously being formed, it is also necessary to have independent control of the thickness of the gate oxide for these devices.

SUMMARY OF THE INVENTION

A method of making a floating gate storage device including the steps of forming a first insulating layer on a semiconductor substrate, applying a first electroconductive layer to said first insulating layer and then forming a mask on said first electroconductive layer. The gate oxide is then partially formed on areas not subtended by the mask. The mask is removed and the gate oxide is completely formed. A second insulating layer is formed on the exposed portions of the first electroconductive layer. A second electroconductive layer is then formed on the second insulating layer and on portions of the gate oxide.

DETAILED DESCRIPTION OF THE PREFERRED EMBODIMENT

Referring to FIGS. 2a to 2i, the method of the present invention will be described for making an n-channel EEPROM (Electrically Erasable Programmable Read Only Memory) device.

Figure 1:
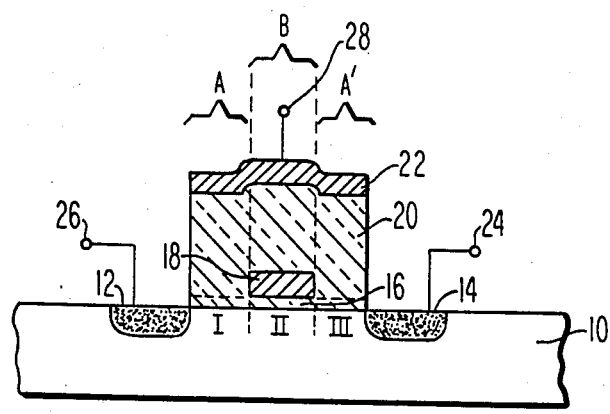
FIG. 1 is a cross-sectional view of the floating gate memory cell found in the prior art.
Figure 2A:
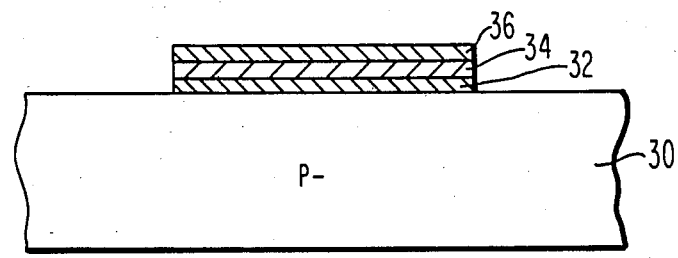
FIGS. 2a to 2i are sectional views of the memory cell illustrating the steps of the method of the present invention.

As shown in FIG. 2a, the method of the present invention starts with a single crystal silicon substrate 30 which has been lightly doped with a p-type dopant. A thin first insulating layer 32 of silicon dioxide is formed on the exposed surface of the silicon substrate 30. The first insulating layer 32 is formed by heating the substrate to a temperature of about 800° C. in an oxygen atmosphere containing about 10% steam for about 45 minutes. The $SiO_2$ layer 32 typically has a thickness of about 100 Å. A layer 34 of polycrystalline silicon, having a thickness of about 2000–5000 Å, is then deposited atop the first insulating layer 32 using conventional chemical vapor deposition techniques. Then, an oxidation resistant mask 36 having a thickness of about 2000 Å is formed on the polycrystalline silicon layer 34. This oxidation resistant mask 36 is typically formed by chemically vapor depositing silicon nitride on the polycrystalline silicon layer 34. The silicon nitride layer is then patterned to correspond to the configuration of the active-area region by conventional photolithographic and etching techniques. The portions of layers 32 and 34 not subtended by the mask 36 are removed using conventional plasma etching techniques. Alternatively (not shown), only the portions or the layer 34 not subtended by the mask 36 are removed. The remaining exposed areas of the oxide layer 32 are then used to form a portion of the field oxide.

Figure 2B:
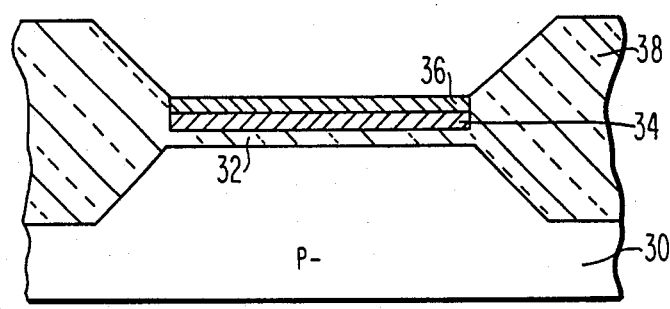

The structure shown in FIG. 2a is then heated to a temperature of about 1100° C. in a steam atmosphere for about 2 hours. As shown in FIG. 2b, the field oxide regions 38 are grown to a thickness of about 10,000 Å. The oxidation resistant mask 36 is then removed using a conventional wet etchant, such as $H_3PO_4$.

Figure 2C:
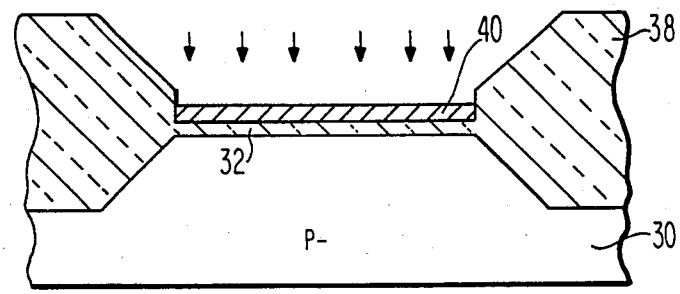

The exposed polycrystalline silicon layer 34 is then heavily doped with an n-type dopant to form the first electroconductive layer 40 shown in FIG. 2c. The dopants, typically phosphorus or arsenic, are introduced into the polycrystalline layer by conventional diffusion or ion implantation techniques.

Figure 2D:
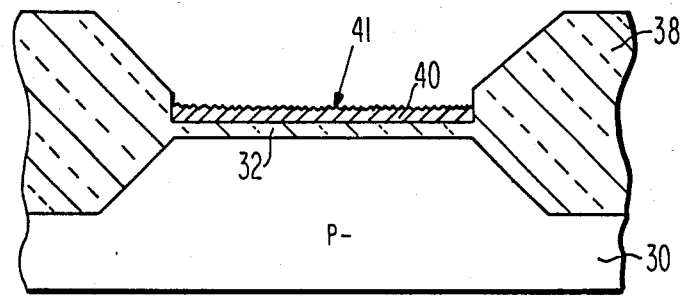

The first electroconductive or doped polycrystalline layer 40 is then heated to a temperature of about 800° C. in an atmosphere of oxygen and steam. This treatment oxidizes the exposed surface of the doped polycrystalline silicon layer 40. As the layer 40 is oxidized, its interface with the thermally grown oxide layer becomes textured. The thermally grown oxide layer is then removed using a conventional wet etchant, such as buffered hydrofluoric acid. The resulting textured surface 41 on the first electroconductive layer 40 is shown in FIG. 2d.

Figure 2E:
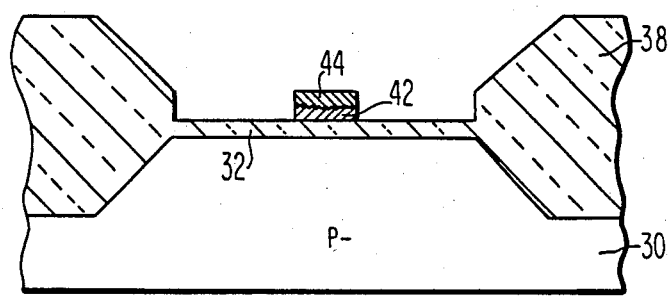

Then, a second oxidation resistant mask 44 having a thickness of about 1000 Å is applied to a portion of the first electroconductive layer 40. This mask 44, typically silicon nitride, is formed using the same techniques as described for the mask 36 in FIG. 2a. The masked structure is then subjected to a conventional plasma etching environment to remove the portions of the first electroconductive layer 40 not subtended by the mask 44. The resulting structure with the floating gate 42 is shown in FIG. 2e. As an alternative technique, the portions of the layer 32 not subtended by layers 42 and 44 may be removed using conventional plasma or wet etching techniques (not shown).

It should be noted that the structure shown in FIG. 2e could also have been achieved by using standard LOCOS (Local Oxidation Of Silicon) techniques. The field oxide would be formed prior to the layers 32 and 34. However, the conductive layer 42 would not be self-aligned to the field oxide edge in the axis perpendicular to the view shown in FIG. 2e.

Figure 2F:
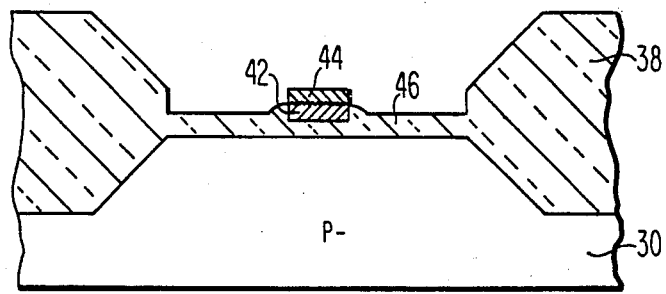

The structure shown in FIG. 2e is heated to a temperature of about 800° C. in an oxygen atmosphere containing about 10% steam for about 1½ hours. During this oxidation step, about 150 Å of $SiO_2$ are added to the exposed portions of the $SiO_2$ layer 32. As shown in FIG. 2f, the newly grown $SiO_2$ and the previously formed $SiO_2$ layer 32 combine to partially form the gate oxide 46. The partially formed gate oxide 46 has a thickness which is about 70% of its final thickness of about 350 Å. If portions of the layer 32 not subtended by the layers 42 and 44 were removed using the alternative technique described above, silicon dioxide would also be thermally grown to partially form the gate oxide 46 to about 70% of its final thickness. It should be noted that the thickness of the partially formed gate oxide may vary depending on the relative oxidation rates of the bulk silicon substrate 30 and the doped polycrystalline silicon gate 42. The desired thicknesses of the gate oxide and the inter-level dielectric will also influence how much of the gate oxide must be grown in FIG. 2f. The primary concern is to grow enough $SiO_2$ during this oxidation step so that the remainder of the gate oxide will be grown when the inter-level dielectric is formed.

Figure 2G:
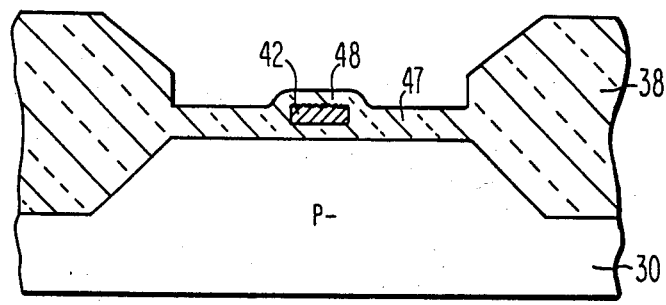

The oxidation resistant mask 44 is removed from the floating gate 42 using conventional wet etchants, such as $H_3PO_4$. The structure is then heated to a temperature of about 800° C. in an oxidizing atmosphere containing oxygen and steam for about 45 minutes. As shown in FIG. 2g, the upper surface of the floating gate 42 is oxidized to form the second insulating layer or inter-level dielectric 48. This second insulating layer 48 is commonly called the tunnel oxide and has a thickness of about 300–400 Å. During this oxidation step, the gate oxide 47 is fully grown to a thickness of about 350 Å.

Figure 2H:
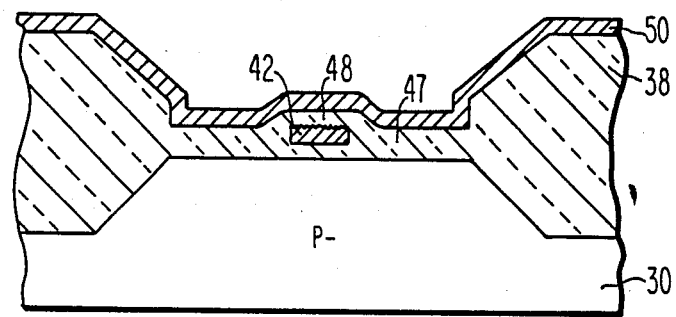
Figure 2I:
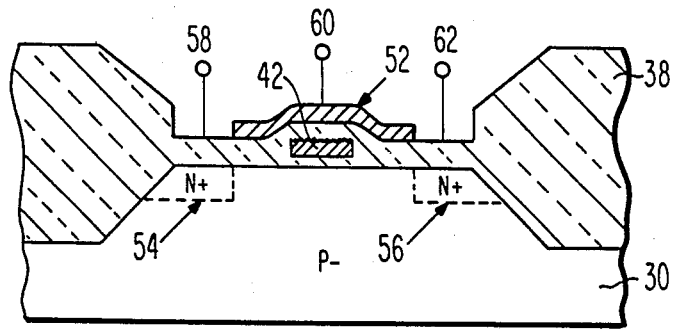

FIG. 2h illustrates that a second electroconductive layer 50, having a thickness of about 5000 Å, is applied to the exposed portions of the device. This layer 50 is typically polycrystalline silicon which has been deposited by chemical vapor deposition techniques and heavily doped with an n-type dopant. However, other conventional gate materials may be substituted for the doped polycrystalline silicon. An etch resistant mask (not shown) is applied directly to a portion of the second electroconductive layer 50. The control gate 52, as shown in FIG. 2i, is patterned by plasma etching the exposed portions of the layer 50 which extend over the gate oxide 47 and the field oxide 38. The etch resistant mask is then removed using conventional techniques.

The source 54 and drain 56 regions are formed using the control gate 52 as a mask. Conventional doping techniques, such as ion implantation, are used to introduce n-type dopants into the substrate 30. Since the control gate 52 is used as a mask for the doping operation, the N+ source 54 and N+ drain 56 regions are self-aligned with the control gate 52. The device is then completed by forming source 58, drain 62 and control gate 60 contacts using conventional techniques, such as physical vapor deposition of a metal.

Although FIGS. 2a to 2i illustrate the process steps for making an n-channel memory cell, the method of the present invention also includes the formation of p-channel devices and the like. For example, a p-channel EEPROM can be fabricated by forming p-type source and drain regions in a lightly doped n-type single crystal silicon substrate using the process steps described above.

The method of the present invention provides for independent control of the inter-level dielectric and gate oxide thicknesses. The single crystalline silicon substrate oxidizes two to four times slower than the n-doped polycrystalline silicon floating gate material. These different oxidation rates make it very difficult to simultaneously grow the inter-level dielectric and the gate oxide to desired thicknesses. The slower substrate oxidation rate is compensated for in the method of the present invention by partially growing the gate oxide while the floating gate is covered with an oxidation resistant mask. The mask is removed and the oxide for both the remainder of the gate oxide and the inter-level dielectric is simultaneously formed in a second oxidation step.

The method of the present invention is used to produce a memory cell which relies on control gate to floating gate conduction to charge and discharge the floating gate. The texturing process used on the floating gate increases the conduction between the control gate and the floating gate. The roughened surface of the floating gate has numerous projections which function as electron emitters. These projections produce high local fields thereby allowing thicker tunnel oxides to be used and/or reducing the overall field strength necessary for the tunneling of electrons from the floating gate to the control gate. Thus, the memory cells produced by the method of the present invention utilize lower programming voltages and have higher programming efficiencies.

A still further advantage of the method of the present invention is in the formation of the floating gate so that it is self-aligned to the active-area. This is critical in memory devices which utilize control gate to floating gate conduction to charge and discharge the floating gate because the amount of control gate to floating gate overlap must be minimized. By minimizing the amount of overlap, the capacitance between the two gates is reduced which increases the cell efficiency. The reduced capacitance also allows for lower voltages to be used to program and erase the memory cell.

I claim:

1. A method of making a floating gate storage device comprising the steps of:
   (a) forming a first insulating layer on a semiconductor substrate;
   (b) forming a first electroconductive layer on a portion of said first insulating layer;
   (c) forming a mask on said first electroconductive layer;
   (d) partially forming the gate oxide on areas not subtended by said mask;
   (e) removing said mask;
   (f) exposing said substrate to an oxidizing atmosphere to complete the formation of the gate oxide and to form a second insulating layer on the exposed portion of said first electroconductive layer; and
   (g) forming a second electroconductive layer on said second insulating layer and on a portion of said gate oxide.

2. A method of making a floating gate storage device in accordance with claim 1 further comprising the step of
   introducing impurities into said semiconductor substrate with said second electroconductive layer functioning as a mask to form source and drain regions.

3. A method of making a floating gate storage device in accordance with claim 2 further comprising the step of
   forming contacts on said source and drain regions.

4. A method of making a floating gate storage device in accordance with claim 2 wherein said impurities are introduced by ion implantation.

5. A method of making a floating gate storage device in accordance with claim 1 wherein said first and second electroconductive layers are n-doped polycrystalline silicon.

6. A method of making a floating gate storage device in accordance with claim 1 wherein said mask is oxidation resistant.

7. A method of making a floating gate storage device in accordance with claim 1 wherein said gate oxide and said second insulating layer are thermally grown silicon dioxide.

8. A method of making a floating gate storage device in accordance with claim 1 wherein said first insulating layer is thermally grown silicon dioxide.

9. A method of making a floating gate storage device in accordance with claim 2 wherein said semiconductor substrate is p-type single crystal silicon and said impurities are n-type.

10. A method of making a floating gate storage device in accordance with claim 2 wherein said semiconductor substrate is n-type single crystal silicon and said impurities are p-type.

11. A method of making a floating gate storage device in accordance with claim 1 wherein the surface of said first electroconductive layer is textured.

12. A method of making a floating gate storage device in accordance with claim 6 wherein the surface of said first electroconductive layer is textured.

13. A method of making a floating gate storage device in accordance with claim 1 wherein said partially formed gate oxide has a thickness of about 70% of its final desired thickess.

14. A method of making a floating gate storage device comprising the steps of:
   (a) forming a first insulating layer on a portion of a semiconductor substrate;
   (b) forming a silicon layer on said first insulating layer;
   (c) forming a first oxidation resistant mask on said silicon layer;
   (d) oxidizing the exposed portions of said semiconductor substrate to form field oxide regions;
   (e) removing said first oxidation resistant mask;
   (f) forming a second oxidation resistant mask on a portion of said silicon layer;
   (g) removing the portions of said silicon layer which are not subtended by said second oxidation resistant mask;
   (h) partially forming the gate oxide on areas not subtended by said second oxidation resistant mask;
   (i) removing said second oxidation resistant mask;
   (j) exposing said substrate to an oxidizing atmosphere to complete the formation of said gate oxide and to form a second insulating layer on the exposed portion of said silicon layer; and
   (k) forming an electroconductive layer on said second insulating layer and on a portion of said gate oxide.

15. A method of making a floating gate storage device in accordance with claim 14 further comprising the step of introducing n-type dopants into said silicon layer.

16. A method of making a floating gate storage device in accordance with claim 15 wherein said silicon layer is polycrystalline silicon.

17. A method of making a floating gate storage device in accordance with claim 14 wherein said partially formed gate oxide has a thickness of about 70% of its final desired thickness.

* * * * *